United States Patent
Zhang (10) Patent No.: US 9,634,044 B2
(45) Date of Patent: Apr. 25, 2017

(54) METHOD FOR FABRICATING ARRAY SUBSTRATE

(71) Applicant: BOE TECHNOLOGY GROUP CO., LTD., Beijing (CN)

(72) Inventor: Fangzhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 321 days.

(21) Appl. No.: 14/347,833

(22) PCT Filed: Apr. 22, 2013

(86) PCT No.: PCT/CN2013/074485
§ 371 (c)(1),
(2) Date: Mar. 27, 2014

(87) PCT Pub. No.: WO2014/127575
PCT Pub. Date: Aug. 28, 2014

(65) Prior Publication Data
US 2016/0211284 A1    Jul. 21, 2016

(30) Foreign Application Priority Data
Feb. 20, 2013  (CN) .......................... 2013 1 0054701

(51) Int. Cl.
*H01L 21/027* (2006.01)
*H01L 27/12* (2006.01)
(Continued)

(52) U.S. Cl.
CPC ...... *H01L 27/1288* (2013.01); *H01L 21/0274* (2013.01); *H01L 21/02532* (2013.01);
(Continued)

(58) Field of Classification Search
CPC ......... H01L 21/02345; H01L 21/02365; H01L 21/02518; H01L 21/70
See application file for complete search history.

(56) References Cited

U.S. PATENT DOCUMENTS

2002/0182833 A1   12/2002  Yang
2009/0111247 A1*   4/2009  Tanaka .................... C30B 29/06
                                                          438/479
(Continued)

FOREIGN PATENT DOCUMENTS

CN       1389911 A      1/2003
CN     101330047 A     12/2008
(Continued)

OTHER PUBLICATIONS

International Preliminary Report on Patentability Appln. No. PCT/CN2013/074485; Dated Aug. 25, 2015.
(Continued)

*Primary Examiner* — Cheung Lee
(74) *Attorney, Agent, or Firm* — Ladas & Parry LLP (57) ABSTRACT

Embodiments of the invention provides a method for fabricating an array substrate comprising: forming, on a substrate, at least two semiconductor active islands, first patterns positioned on both sides of each of the semiconductor active islands, second patterns positioned at outer side of a part of the first patterns, and third patterns positioned at outer side of the rest of the first patterns, through a single patterning process; doping a semiconductor at the second patterns for once to form a semiconductor of a first conductivity type; and doping a semiconductor at the third patterns for once to form a semiconductor of a second conductivity type.

16 Claims, 6 Drawing Sheets

(51) Int. Cl.
  *H01L 21/265* (2006.01)
  *H01L 29/786* (2006.01)
  *H01L 21/02* (2006.01)
  *H01L 21/306* (2006.01)
  *H01L 29/167* (2006.01)
  *H01L 29/66* (2006.01)

(52) U.S. Cl.
  CPC ...... *H01L 21/02595* (2013.01); *H01L 21/265* (2013.01); *H01L 21/30604* (2013.01); *H01L 29/167* (2013.01); *H01L 29/66575* (2013.01); *H01L 29/66757* (2013.01); *H01L 29/78621* (2013.01)

(56) References Cited

U.S. PATENT DOCUMENTS

2012/0119232 A1   5/2012   Song et al.
2012/0171822 A1   7/2012   Yuan et al.

FOREIGN PATENT DOCUMENTS

| CN | 101645417 A | 2/2010 |
| CN | 102456619 A | 5/2012 |
| CN | 102543860 A | 7/2012 |
| CN | 102683338 A | 9/2012 |

OTHER PUBLICATIONS

International Search Report mailed Nov. 28, 2013; PCT/CN2013/074485.
First Chinese Office Action dated Jul. 14, 2014; Appln. No. 201310054701.9.
Second Chinese Office Action dated Jan. 6, 2015; Appl. No. 201310054701.9.

* cited by examiner

METHOD FOR FABRICATING ARRAY SUBSTRATE

FIELD OF THE ART

Embodiments of the invention relate to the field of display technology, more particularly, to a method for fabricating an array substrate.

BACKGROUND

Low Temperature Poly-Silicon Thin Film Field Effect Transistor (LTPS-TFT) Liquid Crystal Displays (LCDs) have the advantages of having higher resolution, quick response, increased brightness, higher aperture ratio and so on. Due to the characteristics of LTPS, it further has higher electron mobility. Moreover, peripheral driver circuitry may be fabricated on the substrate, achieving the objective of system integration, saving space and driver IC cost and reducing defect rate of the product.

Currently, LTPS-TFTs have more varied applications. However, the conventional technologies perform light dope in doping the semiconductor layer to solve the issue of LTPS-TFTs having too large leakage current. Such a method requires multiple doping processes when fabricating the LTPS-TFT array substrate, thereby increasing the number of patterning processes, and rendering the fabrication process complicated, the fabrication procedure heavy, and material consumption high, which further increases the fabrication time and cost.

SUMMARY

An embodiment of the invention provides a method for fabricating an array substrate, which can reduce the number of doping and patterning processes and the fabrication cost.

To achieve the above objective, the embodiment of the invention employs the following technical solution.

A first aspect of the invention provides a method for fabricating an array substrate, comprising:

forming, on a substrate, at least two semiconductor active islands, first patterns positioned on both sides of each of the semiconductor active islands, second patterns positioned at outer side of a part of the first patterns, and third patterns positioned at outer side of the rest of the first patterns, through a single patterning process;

doping a semiconductor at the second patterns for once to form a semiconductor of a first conductivity type; and doping a semiconductor at the third patterns for once to form a semiconductor of a second conductivity type.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERICAL REFERENCE 10-substrate; 11-polysilicon layer; 12-semiconductor active island; 11b-first pattern; 11c-second pattern; 11d-third pattern; 12-photoresist; 12a-photoresist-completely-retained region; 12b-first photoresist-partially-retained region; 12c-second photoresist-partially-retained region; 12d-photoresist-completely-removed region; 13-tri-tone mask; 13a-opaque region; 13b-first semi-transparent region; 13b-second semi-transparent region; 13d-transparent region; 14-gate insulation layer; 14a-first via hole; 15-gate electrode pattern; 16-protection layer; 16a-second via hole; 17a-source electrode pattern; 17b-drain electrode pattern; 18-pixel electrode pattern; 19-common electrode pattern.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the invention provides a method for fabricating an array substrate, comprising: forming, on a substrate, at least two semiconductor active islands, first patterns positioned on both sides of each of the semiconductor active islands, second patterns positioned at outer side of a part of the first patterns, and a third pattern positioned at outer side of the rest of the first patterns, through a single patterning process; doping a semiconductor at the second patterns for once to form the semiconductor of a first conductivity type; and doping a semiconductor at the third patterns for once to form the semiconductor of a second conductivity type.

Please note that a single patterning process refers to forming a certain pattern using a single mask. In the embodiment, the "pattern" may be for example a strip made of a material such as polysilicon and extending along the direction which is perpendicular to the plane of FIG. 4. "both sides of an island or a pattern" refers to two opposite sides of the island or the pattern. "outer side of an island or a pattern" refers to a side opposed to the inner side of the island or pattern.

In the embodiment of the invention, the conductivity type is determined by the majority carriers in the semiconductor. If the majority carriers in a semiconductor of a first conductivity type are holes, then the first conductivity type is P type. If the majority carriers in a semiconductor of a first conductivity type are electrons, then the first conductivity type is N type. When the first conductivity type is N type, the second conductivity type is P type, and vice versa.

The embodiment of the invention provides a method for fabricating an array substrate, which comprises: forming at least two semiconductor active islands, first patterns positioned on both sides of each of the semiconductor active islands, second patterns positioned at outer sides of a part of the first patterns, and third patterns positioned at outer sides of the rest of the first patterns on a substrate through a single patterning process; doping semiconductor at the second and third patterns with two individual doping processes; and sequentially forming a gate insulation layer, a gate metal layer and a protection layer. The method may further comprises: forming a first via hole positioned in the gate insulation layer and a second via hole positioned in the protection layer through a single patterning process to expose the third patterns, and a single doping process is used to doping the semiconductor at the third patterns accordingly, and then a source/drain metal layer comprising a source/drain electrode pattern and a pixel electrode pattern electrically connected to the drain electrode pattern are formed via a patterning process. In comparison with the conventional technology, the method of the invention can reduce the number of doping and patterning processes and thereby reducing the fabrication cost.

Furthermore, foaming at least two semiconductor active islands, first patterns positioned on both sides of each of the semiconductor active islands, second patterns positioned at outer side of a part of the first pattern, and third patterns positioned at outer side of the rest of the first patterns through a single patterning process may comprise: forming a polysilicon layer on the substrate; forming a photoresist on the polysilicon layer; exposing and developing the photoresist by using a tri-tone mask, and etching the polysilicon to form the at least two semiconductor active islands, the first patterns positioned on both sides of each of the semiconductor active islands, the second patterns positioned at outer side of a part of the first patterns, and the third patterns positioned at outer side of the rest of the first patterns.

It is noted that in all embodiments of the invention the description of forming a polysilicon layer on the substrate and forming a photoresist on the polysilicon layer refers to conventional film forming methods such as deposition, coating and so on, which will not be limited here.

For example, forming a polysilicon layer on the substrate may be realized with the following steps: depositing an amorphous silicon (a-Si) layer on the substrate by using Plasma Enhanced Chemical Vapor Deposition (PECVD); dehydrogenating the a-Si layer in a high temperature oven to prevent hydrogen decrepitation during the crystallization and reduce the defect state density internal to the crystallized thin film; after the dehydrogenation, performing a Low Temperature Poly-Silicon (LTPS) process to crystallize the a-Si layer, i.e., using crystallization methods such as Excimer Laser Annealing (ELA), Metal Induced Crystallization (MIC) or Solid Phase Crystallization (SPC), and eventually forming the polysilicon layer on the substrate.

Furthermore, a buffer layer may be deposited on the substrate before depositing the polysilicon layer, so as to prevent harmful substances in the substrate such as alkali metal ions from affecting the property of the polysilicon layer.

Furthermore, exposing and developing the photoresist by using a tri-tone mask, and etching the polysilicon to form the at least two semiconductor active islands, the first patterns positioned on both sides of each of the semiconductor active islands, the second patterns positioned at outer side of a part of the first patterns, and the third patterns positioned at outer side of the rest of the first patterns may comprise: exposing and developing the photoresist by using the tri-tune mask to form a photoresist-completely-retained region, a first photoresist-partially-retained region, a second photoresist-partially-retained region and a photoresist-completely-removed region, a thickness of the first photoresist-partially-retained region is larger than that of the second photoresist-partially-retained region.

The photoresist-completely-retained region corresponds to the at least two semiconductor active islands and the third patterns to be foamed, the first photoresist-partially-retained region corresponds to the first patterns to be formed, the second photoresist-partially-retained region corresponds to the second patterns to be formed, and the photoresist-completely-removed region corresponds to a void region (a region having no patterns).

Removing the polysilicon in the photoresist-completely-removed region via an etching process to form the at least two semiconductor islands, and the first patterns positioned on both sides of each of the semiconductor active islands, the second patterns positioned at outer side of a part of the first patterns, and the third patterns positioned at outer side of the rest of the first patterns.

Removing the photoresist in the second photoresist-partially-retained region via a first ashing process; removing the photoresist in the first photoresist-partially-retained region via a second ashing process; and removing the photoresist in the photoresist-completely-retained region via ashing or peeling process.

Figure 1:
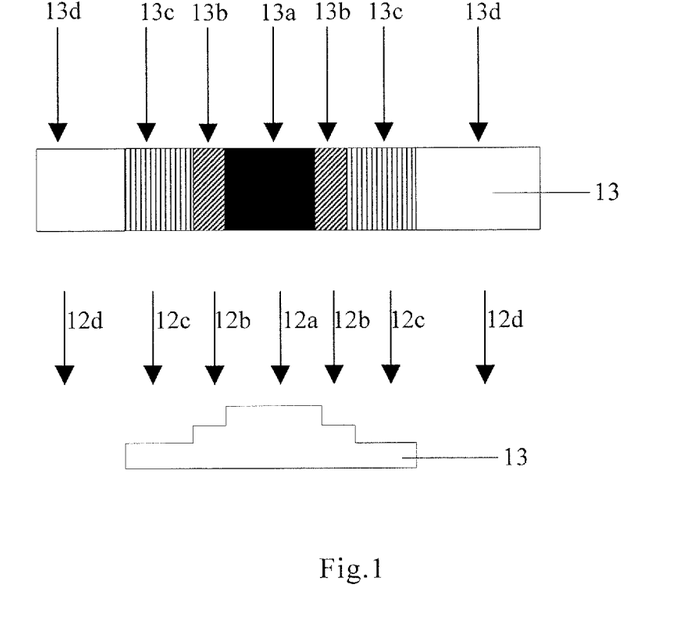
FIG. 1 schematically illustrates a tri-tone mask provided by an embodiment of the invention.

In the following, the key principle of the tri-tone mask 13 will be explained with reference to FIG. 1. The tri-tone mask 13 selectively exposes and develops the photoresist by transmitting light of different intensities in different regions through the grating effect. FIG. 1 illustrates a procedure of exposing a photoresist using the tri-tone mask 13. The tri-tone mask 13 comprises an opaque region 13a, a first semi-transparent region 13b, a second semi-transparent region 13c and a fully transparent region 13d, wherein the first semi-transparent region 13b has a lower transmitivity for the exposure light than the second semi-transparent region 13c.

After being exposed and developed, the photoresist 12 comprises a photoresist-completely-retained region 12a, a first photoresist-partially-retained region 12b, a second photoresist-partially-retained region 12c and a photoresist-completely-removed region 12d, wherein the photoresist-completely-retained region 12a corresponds to the opaque region 13a of the tri-tone mask 13, the first photoresist-partially-retained region 12b corresponds to the first semi-transparent region 13b, the second photoresist-partially-retained region 12c corresponds to the second semi-transparent region 13c, and the photoresist-completely-removed region 12d corresponds to the transparent region 13d.

As the first semi-transparent region 13b has a lower transmitivity for the exposure light than the second semi-transparent region 13c, accordingly, a thickness of the first photoresist-partially-retained region 12b of the photoresist corresponding to the first semi-transparent region 13b is larger than that of the second photoresist-partially-retained region 12c of the photoresist corresponding to the second semi-transparent region 13c. Therefore, when removing the photoresist, a first ashing process may be firstly used to remove the photoresist in the second photoresist-partially-retained region 12c, and then a second ashing process may be used to remove the photoresist in the first photoresist-partially-retained region 12b, next, the remaining photoresist in the photoresist-completely-retained region 12a may be peeled off.

In the embodiment of the invention, based on the above description of the tri-tone mask and the corresponding photoresist regions, and the requirement of the doping process which will be discussed in the next context, it is preferable that the semiconductor active island and the third pattern to be formed corresponds to the photoresist-completely-retained region, the first pattern to be formed corresponds to the first photoresist-partially-retained region, the second pattern to be formed corresponds to the second photoresist-partially-retained region, and the void region corresponds to the photoresist-completely-removed region.

Preferably, the exposed semiconductor at the second pattern is doped with a first dopant to form the semiconductor of the first conductivity type after removing the photoresist of the second photoresist-partially-retained region via the first ashing process and before removing the photoresist in the first photoresist-partially-retained region via the second ashing process.

More specifically, for example, the exposed polysilicon at the second pattern is doped with boron, such that the polysilicon becomes the P-type semiconductor. Alternatively, the exposed polysilicon at the second pattern is doped with phosphor, such that the polysilicon becomes the N-type semiconductor.

Preferably, the exposed semiconductor at the first pattern is light-doped for once after removing the photoresist in the first photoresist-partially-retained region via the second ashing process and before removing the photoresist in the photoresist-completely-retained region via ashing or peeling process.

Considering the limitation of the doping process, the first via hole and the second via hole are formed to expose at least the third pattern preferably comprises: the first via hole and the second via hole are formed to expose the second pattern and the third pattern. In this case, doping the semiconductor at the third pattern once to form the semiconductor of the second conductivity type may comprise: doping the exposed semiconductor at the second and third patterns with a second dopant, to form the semiconductor of the second conductivity type at the third pattern, wherein the doping amount of the second dopant is less than that of the first dopant.

Preferably, the doping amount of the second dopant is a half of the first dopant.

By this means, the first dopant is dominant in the second pattern such that the semiconductor at the second pattern is still of the first conductivity type.

Figure 2:
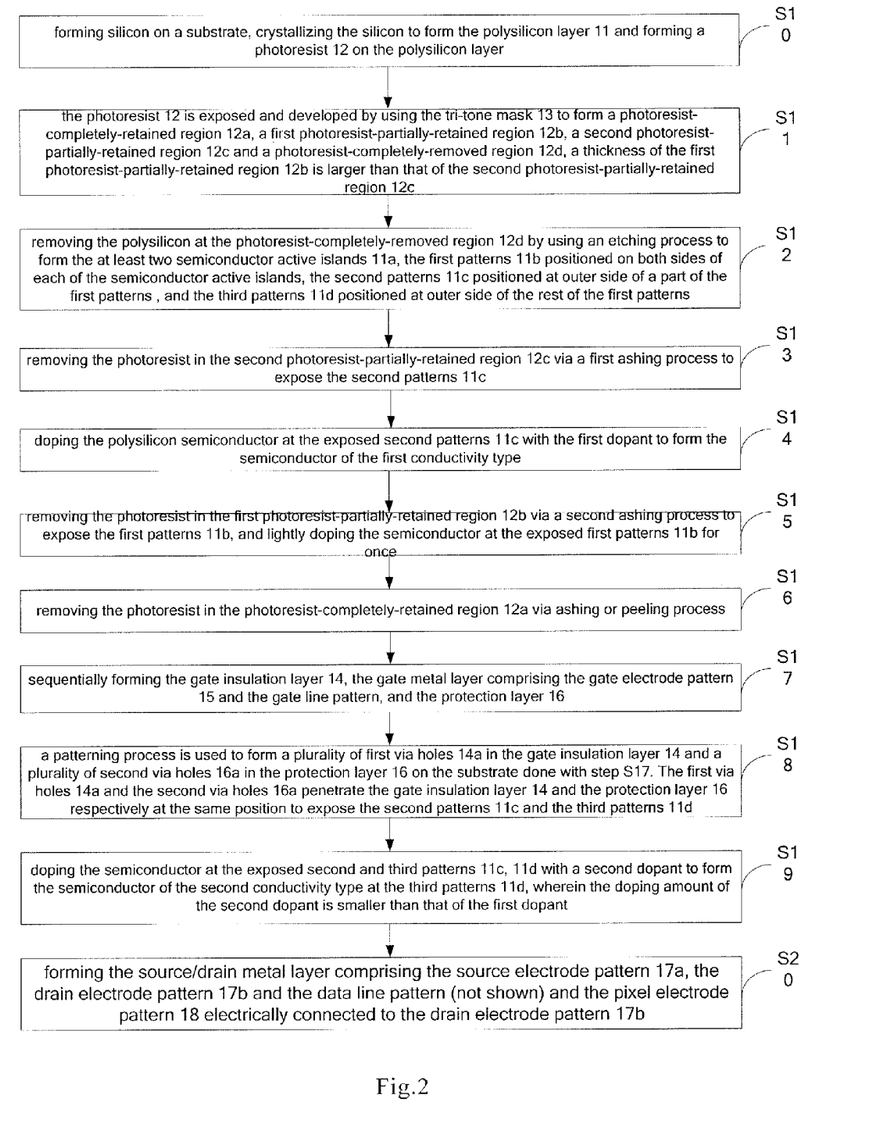
FIG. 2 schematically illustrates a flow chart of a method for fabricating an array substrate provided by an embodiment of the invention.
Figure 3:
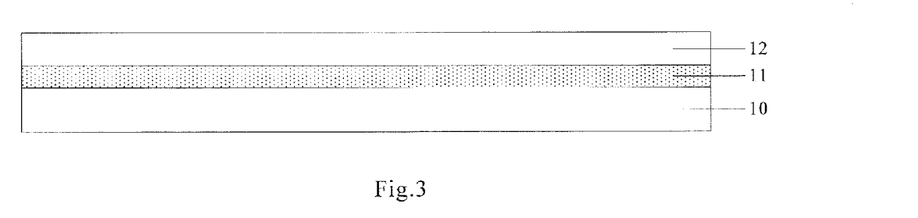
FIG. 3 schematically illustrates a first cross section view of an array substrate in method for fabricating an array substrate provided an embodiment of the invention.

An embodiment of the invention provides a method for fabricating an array substrate as illustrated in FIG. 2, the method comprises the following steps:

S10: forming silicon on a substrate, crystallizing the silicon to form the polysilicon layer 11 as shown in FIG. 3 and forming a photoresist 12 on the polysilicon layer 11.

For example, an a-Si layer may be deposited on the substrate by using PECVD and then the a-Si layer is dehydrogenated in a high temperature oven. After that a LTPS process is performed to crystallize the a-Si layer by using crystallization methods such as ELA, MIC or SPC and eventually the polysilicon layer is formed on the substrate. Next the photoresist layer 12 is applied to the polysilicon layer 11.

Figure 4:
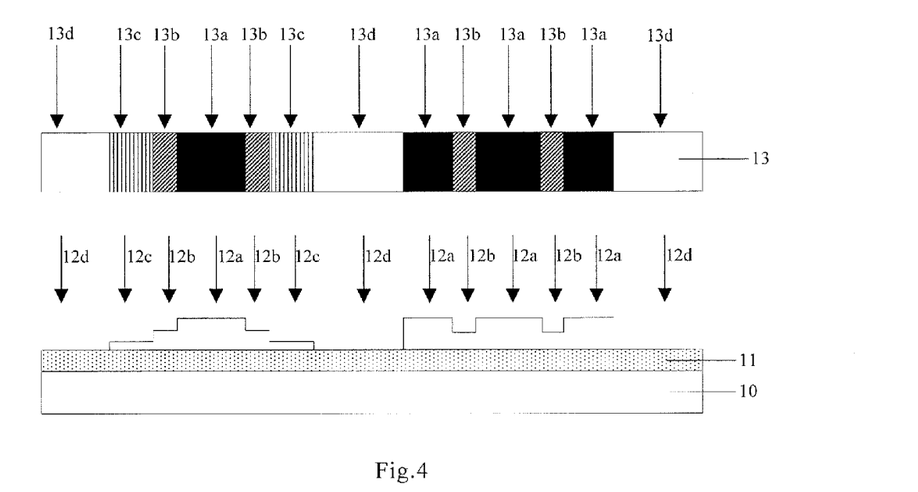
FIG. 4 schematically illustrates a second cross section view of an array substrate in method for fabricating an array substrate provided an embodiment of the invention.

S11: as illustrated in FIG. 4, the photoresist 12 is exposed and developed by using the tri-tone mask 13 to form a photoresist-completely-retained region 12a, a first photoresist-partially-retained region 12b, a second photoresist-partially-retained region 12c and a photoresist-completely-removed region 12d, a thickness of the first photoresist-partially-retained region 12b is larger than that of the second photoresist-partially-retained region 12c.

Figure 5:
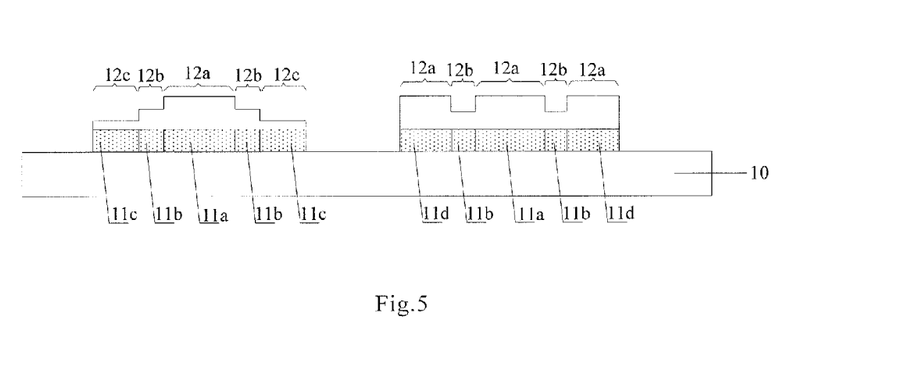
FIG. 5 schematically illustrates a third cross section view of an array substrate in method for fabricating an array substrate provided an embodiment of the invention.

As illustrated in FIG. 5, the photoresist-completely-retained region 12a corresponds to the at least two semiconductor active islands 11a and the third pattern 11d to be formed, the first photoresist-partially-retained region 12b corresponds to the first pattern 11b to be formed, the second photoresist-partially-retained region 12c corresponds to the second pattern 11c to be formed, and the photoresist-completely-removed region 12d corresponds to a blank region (see FIG. 4).

The configuration of the tri-tone mask 13 is similar to that shown in FIG. 1 and will not be elaborated.

Moreover, there are many different types of photoresist, which may be divided into negative photoresist and positive photoresist based on their chemical reaction principle and the development principle. A photoresist becoming an insoluble substance when irradiated is a negative photoresist. On the other hand, a photoresist becoming a soluble substance when irradiated is a positive photoresist. The photoresist may be divided into several regions with different light transmitivities based on the locations of patterns to be fabricated on the substrate. For example, taking the positive photoresist as an example, in the tri-tone mask 13, the region corresponding to the photoresist-completely-removed region 12d is a fully exposed region and uses a transmissive material; the region corresponding to the photoresist-partially-retained region is a partially exposed region and uses a semi-transmissive material. The photoresist-partially-retained region is further divided into the first photoresist-partially-retained region 12b and the second photoresist-partially-retained region 12c based on different light transmitivities of the semi-transmissive material in individual regions 12b, 12c. The region in the tri-tone mask 13 corresponding to the photoresist-completely-retained region 12a is an unexposed region and uses an opaque material.

On the other hand, if the photoresist is negative, then the region in the tri-tune mask 13 corresponding to the photoresist-completely-removed region 12 is the unexposed region and uses an opaque material; the region in the tri-tune mask 13 corresponding to the photoresist-completely-retained region 12a is the fully exposed region and uses a transmissive material; the region in the tri-tune mask 13 corresponding to the photoresist-partially-retained region is the partially exposed region and uses a semi-transmissive material.

It is seen from the above description of the photoresist that all the embodiments of the invention take the positive photoresist as examples, though the embodiments of the invention are not limited to that and may use negative photoresist.

S12: removing the polysilicon at the photoresist-completely-removed region 12d by using an etching process to form the at least two semiconductor active islands 11a, the first patterns 11b positioned on both sides of each of the semiconductor active islands, the second patterns 11c positioned at outer side of one of the first patterns (that is, the outmost sides of the left semiconductor active island), and the third patterns 11d positioned at outer side of another first pattern (that is, the outmost sides of the right semiconductor active island), as shown in FIG. 5.

Figure 6:
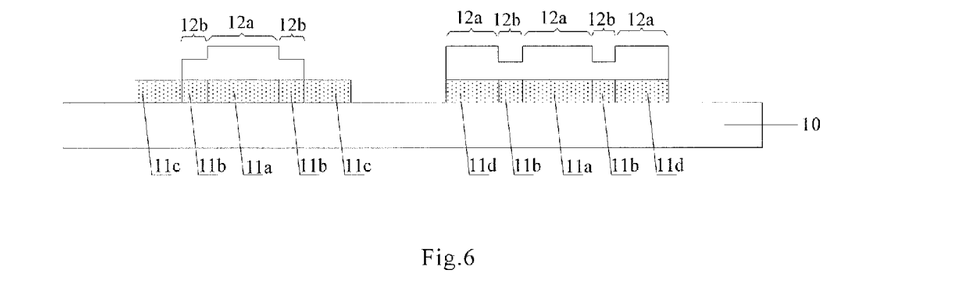
FIG. 6 schematically illustrates a fourth cross section view of an array substrate in method for fabricating an array substrate provided an embodiment of the invention.

S13: as illustrated in FIG. 6, removing the photoresist in the second photoresist-partially-retained region 12c via a first ashing process to expose the second patterns 11c.

Figure 7:
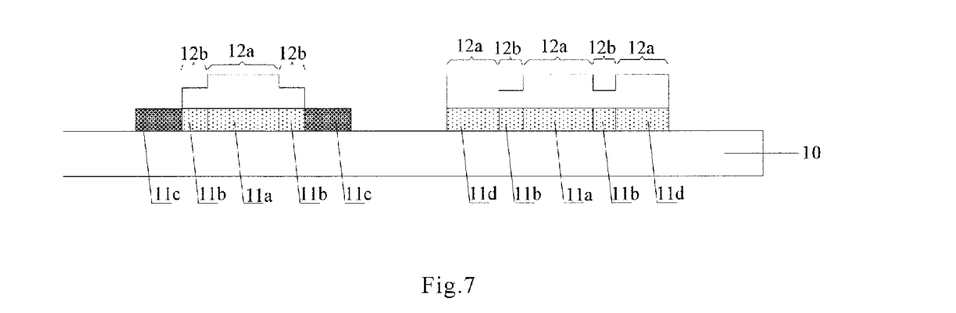
FIG. 7 schematically illustrates a fifth cross section view of an array substrate in method for fabricating an array substrate provided an embodiment of the invention.

S14: as illustrated in FIG. 7, doping the polysilicon semiconductor at the exposed second patterns 11c with the first dopant to form the semiconductor of the first conductivity type.

For example, the first dopant can be for example boron. In this case, the first conductivity type is P type and the second conductivity type is N type. Naturally, the first dopant can also be phosphor. In this case, the first conductivity type is N type and the second conductivity type is P type.

Figure 8:
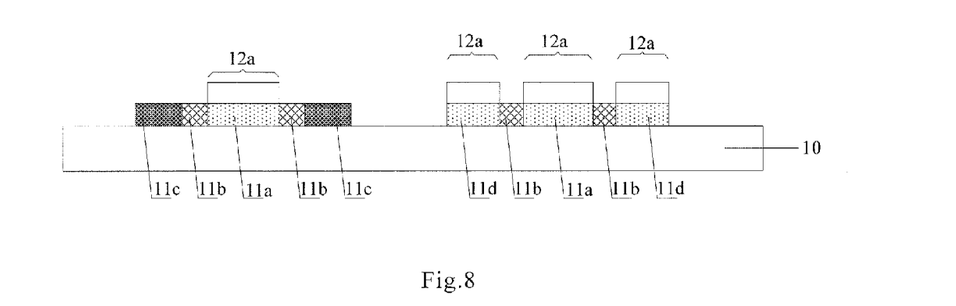
FIG. 8 schematically illustrates a sixth cross section view of an array substrate in method for fabricating an array substrate provided an embodiment of the invention.

S15: as illustrated in FIG. 8, removing the photoresist in the first photoresist-partially-retained region 12b via a second ashing process to expose the first patterns 11b, and lightly doping the semiconductor at the exposed first patterns 11b for once.

The purpose of the doping is to reduce the leakage current of the polysilicon thin film transistor. The light doping process is a conventional technology in the field and will not be elaborated here. However, the invention can also be realized without the light doping process.

Figure 9:
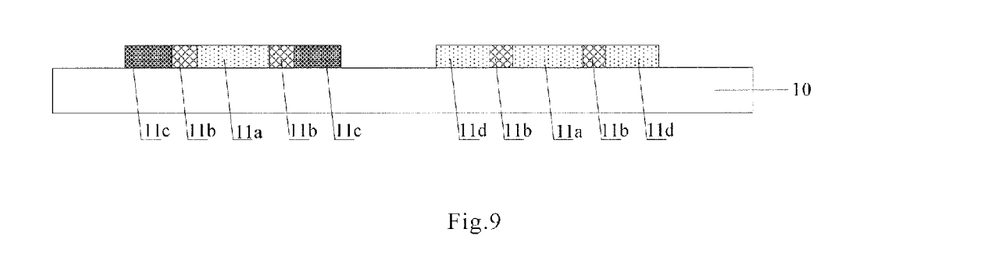
FIG. 9 schematically illustrates a seventh cross section view of an array substrate in method for fabricating an array substrate provided an embodiment of the invention.

S16: as illustrated in FIG. 9, removing the photoresist in the photoresist-completely-retained region 12a via ashing or peeling process.

Figure 10:
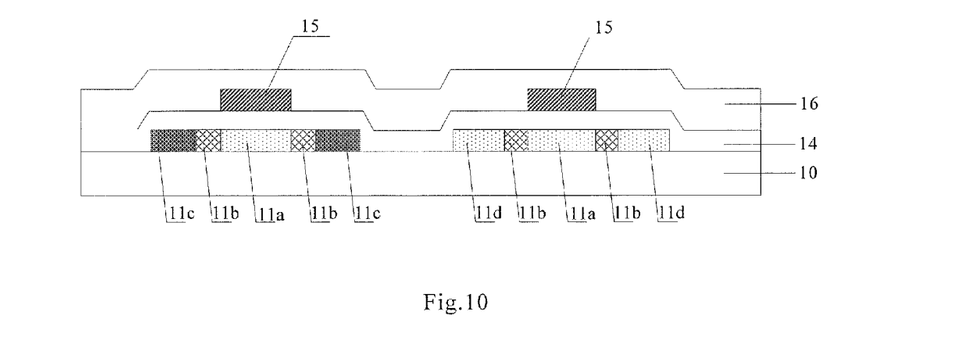
FIG. 10 schematically illustrates a eighth cross section view of an array substrate in method for fabricating an array substrate provided an embodiment of the invention.

S17: as illustrated in FIG. 10, sequentially forming the gate insulation layer 14, the gate metal layer comprising the gate electrode pattern 15 and the gate line pattern (not shown in the figure) and the protection layer 16 on the substrate done with step S16.

Figure 11:
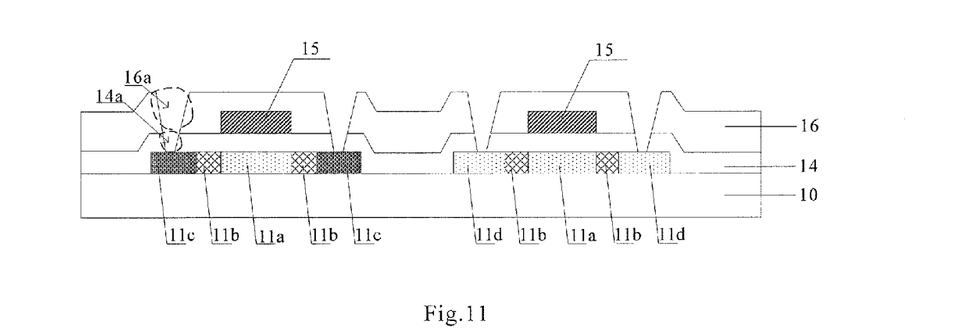
FIG. 11 schematically illustrates a ninth cross section view of an array substrate in method for fabricating an array substrate provided an embodiment of the invention.

S18: as illustrated in FIG. 11, a patterning process is used to form a plurality of first via holes 14a in the gate insulation layer 14 and a plurality of second via holes 16a in the protection layer 16 on the substrate done with step S17. The first via holes 14a and the second via holes 16a penetrate the gate insulation layer 14 and the protection layer 16 respectively at the same position to expose the second patterns 11c and the third patterns 11d.

Figure 12:
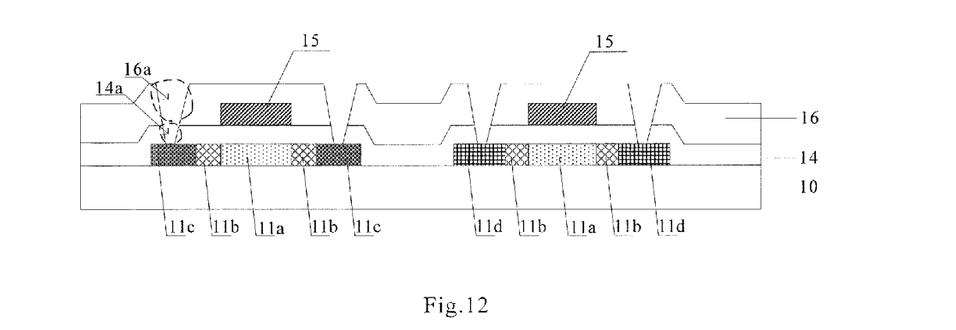
FIG. 12 schematically illustrates a tenth cross section view of an array substrate in method for fabricating an array substrate provided an embodiment of the invention.

S19: as illustrated in FIG. 12, doping the semiconductor at the exposed second and third patterns 11d with a second dopant to form the semiconductor of the second conductivity type at the third patterns 11d, wherein the doping amount of the second dopant is smaller than that of the first dopant.

Considering the limitation of the doping process, the semiconductor at the second and third patterns 11c and 11d is doped with a second dopant. However, the doping amount of the second dopant is less than that of the first dopant such that the semiconductor at the second patterns 11c is still of the first conductivity type. Preferably, the doping amount of the second dopant is a half of the first dopant.

For example, when the first conductivity type of step S14 is P type, that is, the first dopant doped at S14 is boron, then in the present S19 the second dopant may be phosphor. In this case, the semiconductor of the second conductivity type is N type semiconductor; and the doping amount of phosphor is lower than that of boron. When the first conductivity type of step S14 is N type, that is, the first dopant doped at S14 is phosphor, then in the present S19 the second dopant may be boron. In this case, the semiconductor of the second conductivity type is P type semiconductor; and the doping amount of boron is lower than that of phosphor.

Figure 13:
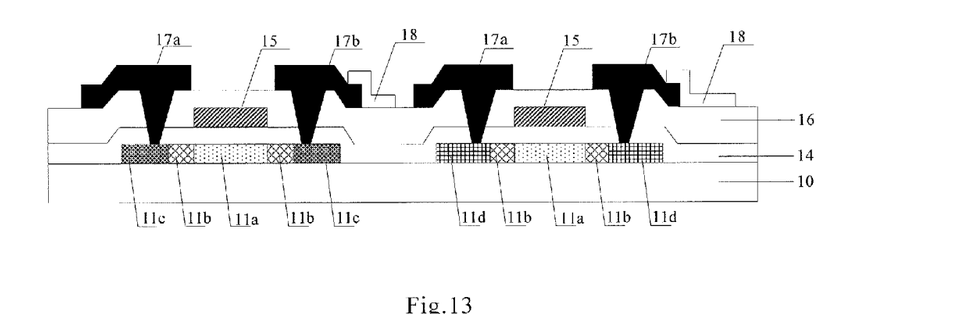
FIG. 13 schematically illustrates a eleventh cross section view of an array substrate in method for fabricating an array substrate provided an embodiment of the invention.

S20: as illustrated in FIG. 13, forming the source/drain metal layer comprising the source electrode pattern 17a, the drain electrode pattern 17b and the data line pattern (not shown) and the pixel electrode pattern 18 electrically connected to the drain electrode pattern 17b on the substrate done with the step S19.

Herein, the source/drain metal layer comprising the source electrode pattern 17a, the drain electrode pattern 17b and the data line pattern is formed first, and then the pixel electrode pattern 18 is formed. However, the embodiment of the invention is not limited to that, it may form the pixel electrode pattern 18 first and then form the source/drain metal layer comprising the source electrode pattern 17a, the drain electrode pattern 17b and the data line pattern.

The embodiment of the invention provides a method for fabricating an array substrate, which comprises: forming at least two semiconductor active islands, first patterns positioned on both sides of each of the semiconductor active islands, second patterns positioned at outer sides of a part of the first patterns, and third patterns positioned at outer sides of the rest of the first patterns on a substrate through a single patterning process; doping the semiconductor at the second patterns for once to form a semiconductor of a first conductivity type, and dopes the semiconductor at the third patterns for once to form a semiconductor of a second conductivity type. As the method of the embodiment of the invention is realized with only one patterning process and two doping processes, it reduces the number of doping and patterning processes and thereby reducing the fabrication cost.

Furthermore, an array substrate made with the method provided by the embodiment of the invention may be adapted for a LCD device, an Organic Light Emitting Device (OLED), an E-paper device, an Advanced Super Dimension Switch (ADS) TFT-LCD, an In-Plane Switching (IPS) TFT-LCD and so on. In the ADS technology, a multi-dimensional electric field is formed with both an electric field produced at edges of pixel electrodes on the same plane and an electric field produced between a pixel electrode layer and a common electrode layer, so that liquid crystal molecules located directly above the electrodes and between the pixel electrodes in a liquid crystal cell can be rotated and aligned, which enhances the work efficiency of planar-oriented liquid crystals and increases light transmittance. The ADS technology can improve the picture quality of TFT-LCDs and has advantages of high transmissivity, wide viewing angles, high opening ratio, low chromatic aberration, low response time, no push Mura, etc. The OLED has a self-luminant property and has the advantage of wide viewing angles, significantly power saving and so on.

Figure 14:
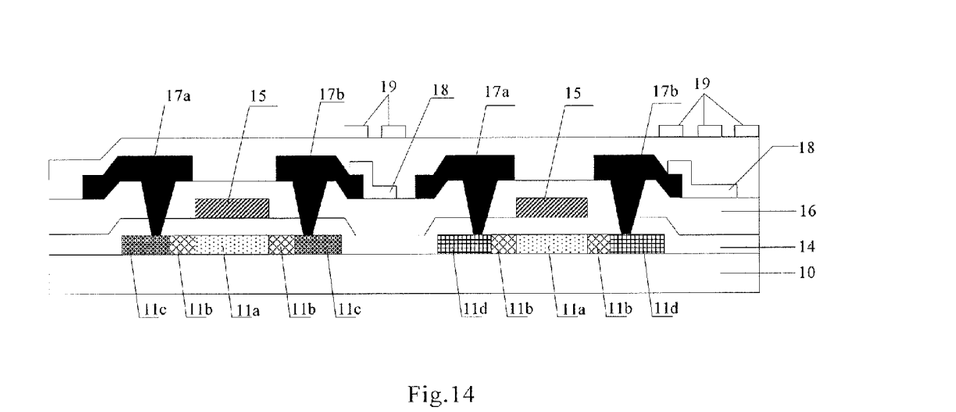
FIG. 14 schematically illustrates a twelfth cross section view of an array substrate in method for fabricating an array substrate provided an embodiment of the invention.

Therefore, in an embodiment, the method for fabricating the array substrate used in the ADS TFT-LCD may further comprise the following step besides the above steps S10 to S20:

S21: as illustrated in FIG. 14, forming the common electrode patterns 19 on the substrate done with step S20.

In another embodiment, the method for fabricating the array substrate used in the IPS TFT-LCD may further comprise the following step besides the above steps S10 to S19:

S20': forming the pixel electrode pattern 1 electrically connected to the drain electrode pattern 17b and the common electrode patterns 19.

What are described above is related to the illustrative embodiments of the disclosure only and not limitative to the scope of the disclosure; the scopes of the disclosure are defined by the accompanying claims.

What is claimed is:

1. A method for fabricating an array substrate, comprising:
forming, on a substrate, at least two semiconductor active islands, first patterns positioned on both sides of each of the semiconductor active islands, second patterns positioned at outer side of a part of the first patterns, and third patterns positioned at outer side of the rest of the first patterns, through a single patterning process;
doping a semiconductor at the second patterns for once to form a semiconductor of a first conductivity type; and
doping a semiconductor at the third patterns for once to form a semiconductor of a second conductivity type;
wherein after doping the semiconductor at the second pattern for once to form the semiconductor of a first conductivity type, the method further comprises:
sequentially forming a gate insulation layer, a gate metal layer comprising a gate electrode pattern, and a protection layer on the substrate done with the previous steps; and forming a first via hole in the gate insulation layer and a second via hole in the protection layer through a single patterning process; the first via hole and the second via hole exposes at least the third patterns.

2. The method of claim 1, wherein forming at least two semiconductor active islands, first patterns positioned on both sides of each of the semiconductor active islands, second patterns positioned at outer side of a part of the first patterns, and third patterns positioned at outer side of the rest of the first patterns through a single patterning process comprises:

forming a polysilicon layer on the substrate;
forming a photoresist on the polysilicon layer;
exposing and developing the photoresist by using a tri-tone mask, and etching the polysilicon layer to form the at least two semiconductor active islands, the first patterns positioned on both sides of each of the semiconductor active islands, the second patterns positioned at outer side of a part of the first patterns, and the third patterns positioned at outer side of the rest of the first patterns.

3. The method of claim 2, wherein exposing and developing the photoresist by using a tri-tone mask, and etching the polysilicon layer to form the at least two semiconductor active islands, the first patterns positioned on both sides of each of the semiconductor active islands, the second patterns positioned at outer side of a part of the first patterns, and the third patterns positioned at outer side of the rest of the first patterns comprises:

exposing and developing the photoresist by using the tri-tone mask to form a photoresist-completely-retained region, a first photoresist-partially-retained region, a second photoresist-partially-retained region and a photoresist-completely-removed region, a thickness of the first photoresist-partially-retained region is larger than that of the second photoresist-partially-retained region; wherein the photoresist-completely-retained region corresponds to the at least two semiconductor active islands and the third patterns to be formed, the first photoresist-partially-retained region corresponds to the first patterns to be formed, the second photoresist-partially-retained region corresponds to the second patterns to be formed, and the photoresist-completely-removed region corresponds to a void region;
removing the polysilicon in the photoresist-completely-removed region via etching to form the at least two semiconductor active islands, the first patterns positioned on both sides of each of the semiconductor active islands, the second patterns positioned at outer side of a part of the first patterns, and the third patterns positioned at outer side of the rest of the first patterns;
removing the photoresist in the second photoresist-partially-retained region via a first ashing process;
removing the photoresist in the first photoresist-partially-retained region via a second ashing process; and
removing the photoresist in the photoresist-completely-retained region via ashing or peeling process.

4. The method of claim 3, wherein doping the semiconductor at the second patterns for once to form a semiconductor of a first conductivity type comprises:
doping the semiconductor at an exposed second patterns with a first dopant to form the semiconductor of a first conductivity type after removing the photoresist of the second photoresist-partially-retained region via the first ashing process and before removing the photoresist in the first photoresist-partially-retained region via the second ashing process.

5. The method of claim 4, wherein the first via hole and the second via hole exposes at least the third pattern comprises: the first via hole and the second via hole exposes the second patterns and the third patterns.

6. The method of claim 5, wherein doping the semiconductor at the third patterns for once to form the semiconductor of a second conductivity type comprises: doping the semiconductor at the exposed second patterns and the exposed third patterns with a second dopant to form the semiconductor of a second conductivity type at the third patterns, wherein a doping amount of the second dopant is smaller than that of the first dopant.

7. The method of claim 6, wherein the doping amount of the second dopant is a half of the doping amount of the first dopant.

8. The method of claim 2, wherein after doping the semiconductor at the second patterns for once to form a semiconductor of a first conductivity type, the method further comprises: lightly doping the semiconductor at the first patterns for once.

9. The method of claim 3, wherein after doping the semiconductor at the second patterns for once to form a semiconductor of a first conductivity type, the method further comprises: lightly doping the semiconductor at the first patterns for once.

10. The method of claim 9, wherein lightly doping the semiconductor at the first patterns for once comprises:
   lightly doping the semiconductor at the exposed first pattern for once after removing the photoresist in the first photoresist-partially-retained region via the second ashing process and before removing the photoresist in the photoresist-completely-retained region via ashing or peeling process.

11. The method of claim 4, wherein after doping the semiconductor at the second patterns for once to form a semiconductor of a first conductivity type, the method further comprises: lightly doping the semiconductor at the first patterns for once.

12. The method of claim 6, wherein the first dopant is one of boron and phosphor, and the second dopant is the other one of boron and phosphor.

13. The method of claim 1, wherein after doping the semiconductor at the second patterns for once to form a semiconductor of a first conductivity type, the method further comprises: lightly doping the semiconductor at the first patterns for once.

14. The method of claim 1, wherein after doping the semiconductor at the third patterns for once to form the semiconductor of a second conductivity type, the method further comprises:
   forming a source/drain metal layer comprising a source/drain electrode pattern and a pixel electrode pattern electrically connected to the source/drain electrode pattern on the substrate done with the previous steps.

15. The method of claim 1, wherein the first conductivity type is P type and the second conductivity type is N type; or the first conductivity type is N type and the second conductivity type is P type.

16. The method of claim 1, wherein the method further comprises forming a common electrode pattern.

* * * * *